United States Patent
Li et al.

(10) Patent No.: US 8,410,559 B2
(45) Date of Patent: Apr. 2, 2013

(54) SELECTIVELY SELF-ASSEMBLING OXYGEN DIFFUSION BARRIER

(75) Inventors: Zhengwen Li, Fishkill, NY (US); Antonio L. P. Rotondaro, Beacon, NY (US); Mark R. Visokay, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 834 days.

(21) Appl. No.: 12/407,007

(22) Filed: Mar. 19, 2009

(65) Prior Publication Data

US 2010/0237442 A1    Sep. 23, 2010

(51) Int. Cl.
*H01L 29/78* (2006.01)
*H01L 21/336* (2006.01)

(52) U.S. Cl. ............... 257/411; 257/E21.625; 438/287; 438/296; 438/591

(58) Field of Classification Search ............... 438/287, 438/591, 785, 296; 257/411, E21.625
See application file for complete search history.

(56) References Cited

U.S. PATENT DOCUMENTS

| | | |
|---|---|---|
| 8,124,485 B1 * | 2/2012 | Goldfarb et al. ............ 438/287 |
| 2010/0237442 A1 * | 9/2010 | Li et al. .................... 257/411 |
| 2011/0215413 A1 * | 9/2011 | Ikeno ........................ 438/216 |

* cited by examiner

*Primary Examiner* — Zandra Smith
*Assistant Examiner* — Toniae Thomas
(74) *Attorney, Agent, or Firm* — Scully, Scott, Murphy & Presser, P.C.; H. Daniel Schnurmann

(57) ABSTRACT

A shallow trench isolation structure is formed in a semiconductor substrate adjacent to an active semiconductor region. A selective self-assembling oxygen barrier layer is formed on the surface of the shallow trench isolation structure that includes a dielectric oxide material. The formation of the selective self-assembling oxygen barrier layer is selective in that it is not formed on the surface the active semiconductor region having a semiconductor surface. The selective self-assembling oxygen barrier layer is a self-assembled monomer layer of a chemical which is a derivative of alkylsilanes including at least one alkylene moiety. The silicon containing portion of the chemical forms polysiloxane, which is bonded to surface silanol groups via Si—O—Si bonds. The monolayer of the chemical is the selective self-assembling oxygen barrier layer that prevents diffusion of oxygen to a high dielectric constant material layer that is subsequently deposited as a gate dielectric.

25 Claims, 5 Drawing Sheets

SELECTIVELY SELF-ASSEMBLING OXYGEN DIFFUSION BARRIER

FIELD OF THE INVENTION

The present invention relates to a semiconductor structure including a selectively self-assembling oxygen diffusion barrier located between an oxide-containing structure in a semiconductor substrate and a high dielectric constant (high-k) material structure, and methods of manufacturing the same.

BACKGROUND OF THE INVENTION

High gate leakage current of silicon oxide and nitrided silicon dioxide as well as depletion effect of polysilicon gate electrodes limits the performance of conventional semiconductor oxide based gate electrodes. High performance devices for an equivalent oxide thickness (EOT) less than 1 nm require high dielectric constant (high-k) gate dielectrics and metal gate electrodes to limit the gate leakage current and provide high on-currents. High dielectric constant typically refers to a dielectric constant grater than 4.0. Materials for high-k gate dielectrics include $ZrO_2$, $HfO_2$, other dielectric metal oxides, alloys thereof, and their silicate alloys.

A high-k dielectric material needs to provide good electrical stability, that is, the amount of charge trapped in the high-k dielectric material needs to remain at a low level even after extended operation of a transistor. The high-k dielectric material needs to be scalable, that is, provide an acceptable level of leakage and acceptable levels of electron and hole mobility at a reduced equivalent oxide thickness (EOT), e.g., less than 1 nm. High-k dielectric materials satisfying these conditions may be advantageously employed for high performance semiconductor devices.

The electrical characteristics of semiconductor devices employing high-k dielectric materials are affected by the oxygen content of the high-k dielectric materials. For example, field effect transistors that employ a gate dielectric including a high-k dielectric material displays variations in the threshold voltage depending on the oxygen content of the high-k dielectric material. Most field effect transistors have a gate dielectric that extends over an active area and a shallow trench isolation structure that surrounds the active area. The effect of the threshold voltage variation may be dependent on the width of the field effect transistor because extra oxygen may be supplied from the shallow trench isolation structure containing silicon oxide into the high-k gate dielectric. The oxygen may laterally diffuse into the portion of the gate dielectric overlying the active area, thereby affecting the threshold voltage of the field effect transistor.

The effect of the oxygen diffusion on the threshold voltage of a field effect transistor is severer on an edge portion of the field effect transistor that is located proximate to the shallow trench isolation structure. For a field effect transistor having a narrow width, i.e., a width that is comparable with the diffusion length of oxygen from a surrounding shallow trench isolation structure, the threshold voltage shift is severe. For a field effect transistor having a wide width, i.e., a width that is far greater than the diffusion length of oxygen from a surrounding shallow trench isolation structure, the threshold voltage shift is less because the effect of the threshold voltage shift is limited to the periphery of the field effect transistor, while the center portion of the field effect transistor displays insignificant, if any, shift in the threshold voltage.

Formation of an oxygen diffusion barrier layer on the entirety of the surface of a semiconductor substrate degrades the device characteristics because the oxygen diffusion barrier layer effectively functions as a portion of a gate dielectric. Formation of an oxygen barrier layer only on the top surface of shallow trench isolation structures by deposition and lithographic patterning increases processing complexity and cost. Nitridation of shallow trench isolation structures invariably induces nitridation of exposed semiconductor surfaces, which degrades device characteristics of semiconductor devices formed on the semiconductor surfaces. If the diffusion of oxygen from shallow trench isolation structures into high-k gate dielectrics is not deterred, the semiconductor devices formed on the semiconductor substrate may have a width dependent variation in the device characteristics such as the threshold voltage of a field effect transistor.

SUMMARY OF THE INVENTION

The present invention provides a selectively self-assembling oxygen barrier layer formed between an oxide-containing structure such as a shallow trench isolation structure in a semiconductor substrate and a high dielectric constant (high-k) material structure such as a gate dielectric, and methods of manufacturing the same.

In the present invention, a shallow trench isolation structure is formed in a semiconductor substrate adjacent to an active semiconductor region. A selective self-assembling oxygen barrier layer is formed on the surface of the shallow trench isolation structure that includes a dielectric oxide material. The formation of the selective self-assembling oxygen barrier layer is selective in that it is not formed on the surface the active semiconductor region having a semiconductor surface. The selective self-assembling oxygen barrier layer is a self-assembled monomer layer of a chemical which is a derivative of alkylsilanes including at least one alkylene moiety. The silicon containing portion of the chemical forms polysiloxane, which is bonded to surface silanol groups via Si—O—Si bonds. The monolayer of the chemical is the selective self-assembling oxygen barrier layer that prevents diffusion of oxygen to a high dielectric constant material layer that is subsequently deposited as a gate dielectric.

According to an aspect of the present invention, a semiconductor structure is provided, which includes: a dielectric material portion embedded in a semiconductor material portion of a substrate; a chemical monolayer bonded to a top surface of the dielectric material portion through Si—O—Si bonds and comprising a self-aligning dielectric molecule including a silicon atom and at least one alkylene moiety; and a metal-oxide-containing dielectric material layer located on a top surface of the semiconductor material portion and the chemical monolayer.

According to another aspect of the present invention, a method of forming a semiconductor structure is provided, which includes: forming a dielectric material portion in a semiconductor material portion of a substrate; forming a dielectric material layer on a top surface of the dielectric material portion selective to an exposed surface of the semiconductor material portion; and forming a metal-oxide-containing dielectric material layer on the exposed surface of the semiconductor material portion and the dielectric material layer.

DETAILED DESCRIPTION OF THE INVENTION

Figure 1:
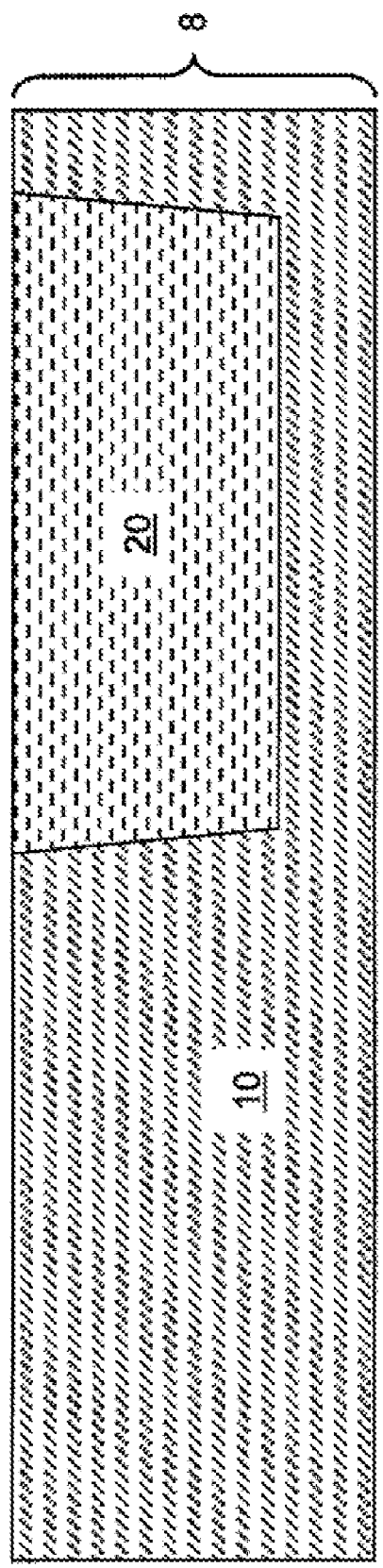
FIG. 1 is a vertical cross-sectional view of an exemplary semiconductor structure after formation of a dielectric material portion according to the present invention.

As stated above, the present invention relates to a semiconductor structure including a selectively self-assembling oxygen diffusion barrier located between an oxide-containing structure in a semiconductor substrate and a high dielectric constant (high-k) material structure and methods of manufacturing the same, which are now described in detail with accompanying figures. Like and corresponding elements are referred to by like reference numerals.

Referring to FIG. 1, an exemplary semiconductor structure according to the present invention is shown, which comprises a substrate 8 including a semiconductor material portion 10 and a dielectric material portion 20. The dielectric material portion 20, which is embedded in the semiconductor material portion 10, has an exposed upper surface. For example, the dielectric material portion 20 may be a shallow trench isolation (STI) structure that laterally surrounds an active region of the semiconductor material portion 10 on which a field effect transistor is to be subsequently formed. The substrate 8 may be a bulk substrate in which the semiconductor material portion 10 extends from a top surface of the substrate 8 to a bottom surface of the substrate 8, a semiconductor-on-insulator (SOI) substrate in which a buried insulator layer (not shown) is included within the substrate 8, or a hybrid substrate including a bulk portion and a semiconductor-on-insulator (SOI) portion. In an SOI substrate, the dielectric material portion 20 typically abuts a top surface of the buried insulator layer.

The semiconductor material portion 10 comprises a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the semiconductor material portion 10 comprises a single crystalline material having an epitaxial atomic alignment throughout. The semiconductor material does not form a hydroxylated surface having —OH groups in an aqueous environment, i.e., in water. The aqueous environment may be provided as water in liquid form, an aerosol of water particles, or a thin layer of water sprayed or deposited in a controlled environment such as vacuum or an ambient of an inert gas. Preferably, the semiconductor material forms a hydrogen terminated surface in an aqueous environment.

The dielectric material portion 20 comprises a dielectric material that forms a hydroxygenated surface having —OH groups in an aqueous environment. For example, the dielectric material portion 20 may include at least one of amorphous silicon oxide, crystalline silicon oxide, borosilicate glass, phosphosilicate glass, fluorosilicate glass, arsenosilicate glass, borophosphosilicate glass, mica, aluminum oxide, and oxidized gold.

The dielectric material portion 20 may be formed as a shallow trench isolation structure. In this case, the substrate 8 may be a semiconductor material portion 10 having a flat top surface. Shallow trenches having a depth from 100 nm to 1,000 nm are then formed on the top surface of the semiconductor material portion 10 by a combination of lithographic patterning of a masking layer, followed by a pattern transfer into an upper portion of the semiconductor material portion 10 by an etch. The masking layer may be a soft mask including a photoresist material, or may be a hard mask including a non-photosensitive dielectric material such as silicon oxide, silicon nitride, or a combination there of. The etch may be a wet etch or a dry etch. In case the shallow trenches include fine features, an anisotropic reactive ion etch may be employed.

A dielectric material that forms a hydroxygenated surface having —OH groups in an aqueous environment is then deposited into the shallow trenches. The dielectric material is subsequently planarized to remove portions overlying the areas of the substrate 8 outside the shallow trenches. The remaining portion of the dielectric material constitutes the dielectric material portion 20. The dielectric material portion 20 may be configured to surround an active semiconductor area of the semiconductor material portion 10. The top surface of the dielectric material portion 20 may be substantially coplanar with the top surface of the semiconductor material portion 10. Optionally, one of the top surface of the dielectric material portion 20 or the top surface of the semiconductor material portion 10 may be recessed relative to the other to provide a temporary height differential, which is employed to compensate for loss of material and provide substantial coplanarity between the top surface of the dielectric material portion 20 and the top surface of the semiconductor material portion 10 eventually at the end of processing steps.

Figure 2:
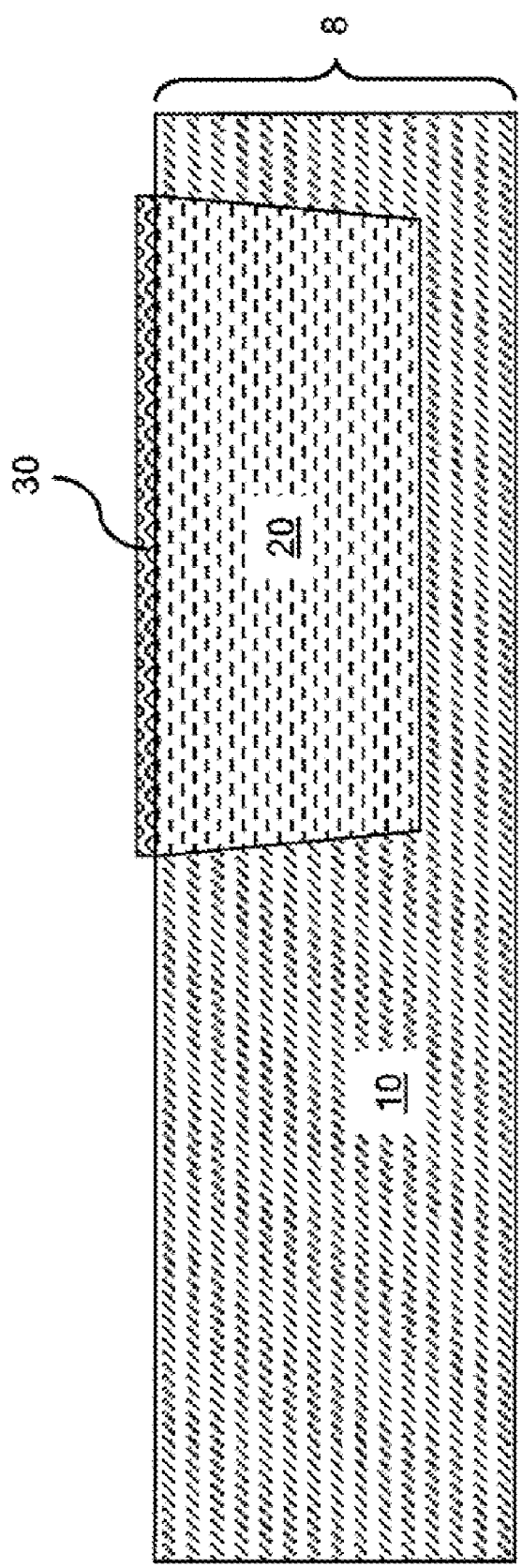
FIG. 2 is a vertical cross-sectional view of the exemplary semiconductor structure after selective formation of a self-assembling chemical monolayer on a top surface of the dielectric material portion according to the present invention.

Referring to FIG. 2, a self-assembling chemical monolayer 30 is formed on a top surface of the dielectric material portion 20 selective to the top surface of the semiconductor material portion 10. The self-assembling chemical monolayer 30 is a monolayer of self-aligning dielectric molecules that are attracted to and bonded to a hydroxygenated surface having —OH groups but does not bond to a surface without —OH groups. Particularly, the self-aligning dielectric molecules are not bonded to a hydrogen terminated surface. Because the self-aligning dielectric molecules self-assembles only on the hydroxygenated surface having —OH groups and moves away from surfaces without —OH groups, the self-assembling chemical monolayer 30 is formed only on the top surface of the dielectric material portion 20, and is not formed on the top surface of the semiconductor material portion 10.

The self-aligning dielectric molecules and the water may be supplied to the top surfaces of the dielectric material portion 20 and the semiconductor material portion 10 in the form of a liquid solution, an aerosol spray, a spin-on coated layer, or a deposited layer. The self-aligning dielectric molecules may have a chemical formula of $SiQ\text{-}(CH_2)_n\text{—}R$. Q is a first functional group that dissociates in water from a silicon atom. The first functional group Q may be $Cl_3$, $Cl_2OX$, $ClOXOY$, or $OXOYOZ$, in which each of X, Y, and Z is independently a hydrogen atom or any of alkyl moieties. Alkyl moieties have the formula $C_lH_m$, in which $m=2\times l+1$. Exemplary alkyl moieties include methyl ($CH_3$), ethyl ($C_2H_5$), and propyl ($C_3H_7$). R is a second functional group including carbon or nitrogen. Preferably, the second functional group R does not include —OH groups. Exemplary radical groups that may be employed for the second functional group R include $CH_3$ and $NH_2$. The alkylene chain —$(CH_2)_n$— connects the SiQ group and the second functional group R. The number n for the repetition of —$CH_2$— units in the alkylene chain —$(CH_2)_n$— is a positive integer. Preferably, n is a positive integer less than 26.

If the first functional group Q is $Cl_3$ and the second functional group R is $CH_3$, the self-aligning dielectric molecule is an alkyltrichlorosilane ($SiCl_3$—$(CH_2)_n$—$CH_3$). In this example, the self-aligning dielectric molecules may be applied employing wet chemistry. A moisture (water concentration) quantity from 0.5 mg per 100 ml to 5 mg per 100 ml may be used to form a closely packed monolayer on a surface including —OH groups. Preferred temperature for application of this solution is less than 50 degrees Celsius. A temperature below 20 degrees Celsius is more preferred to form a high quality monolayer of the self-aligning dielectric molecules. Optionally, a plasma treatment on the monolayer of the self-aligning dielectric molecules may be performed to remove any remaining water molecules and/or to stabilize the structure of the monolayer of the self-aligning dielectric molecules.

The self-aligning dielectric molecules lose the first functional group Q when mixed with water. The top surface of the dielectric material portion 20 becomes hydroxylated and is covered with —OH groups. The first functional group Q is readily dissociated in the aqueous environment of the water over the top surface of the dielectric material portion 20. The derivative of the self-aligning dielectric molecule without the first functional group Q has the form Si—$(CH_2)_n$—R after the first functional group Q is polymerized with other self-aligning molecules and also form Si—O—Si bond from dehydration with the hydroxyl group from semiconductor surface 20.

The silicon atom within the derivative of the self-aligning dielectric molecule is then attracted to the hydroxygenated surface of the dielectric material portion 20. Because the top surface of the semiconductor material portion 10 does not include —OH groups, the derivative of the self-aligning dielectric molecule is not attracted to the top surface of the semiconductor material portion 10. If the top surface of the semiconductor material portion 10 is a hydrogen terminated surface, the derivative of the self-aligning dielectric molecule is repelled from the top surface of the semiconductor material portion. Thus, the derivative of the self-aligning dielectric molecule lines forms the self-assembling chemical monolayer 30 which is selectively formed only on the top surface of the dielectric material portion 20 and limited in extent only within the area of the dielectric material portion 20.

The driving force for the self-assembly is the in-situ formation of polysiloxane, which is connected to the surface including the —OH groups through deletion of the hydrogen atom and bonding with a silicon atom to form —O—Si bonds. If the dielectric material portion 20 includes silicon oxide, the surface of the dielectric material portion includes surface silanol groups (—Si—OH). As the hydrogen atom is dissociated and the silicon atom of the self-aligning dielectric molecule is attached to the oxygen atom, a Si—O—Si bond is formed between the dielectric material portion 20 and the derivative of the self-aligning dielectric molecule.

The self-assembling chemical monolayer 30 functions as an oxygen diffusion barrier. This is because the self-aligning dielectric molecules block oxygen atoms that attempt to diffuse from the dielectric material portion 20 by the silicon atom. Typically, the blocking of the oxygen atom occurs at the interface between the self-assembling chemical monolayer 30 and the dielectric material portion 20.

While the present invention is described with the self-assembling chemical monolayer 30, the present invention may also be practiced with any dielectric material layer that selectively forms on the surface of the dielectric material portion 20, while not forming on the surface of the semiconductor material portion 10. The property of self-assembly is employed to insure that the dielectric material layer (such as the self-assembling chemical monolayer 30) is formed only on the surface of the dielectric material portion 20, while not forming directly on the surface of the semiconductor material portion 10. In general, any dielectric material layer comprising a chemical that self-assembles only on the dielectric material portion 20 and does not form on the surface of the semiconductor material portion 10 may be employed. In general, such a dielectric material layer may be a chemical monolayer comprising a monolayer of the chemical, or may include multiple monolayers of the chemical provided that the dielectric material layer is formed only on the dielectric material portion 20 and does not form on the surface of the semiconductor material portion 10.

Figure 3:
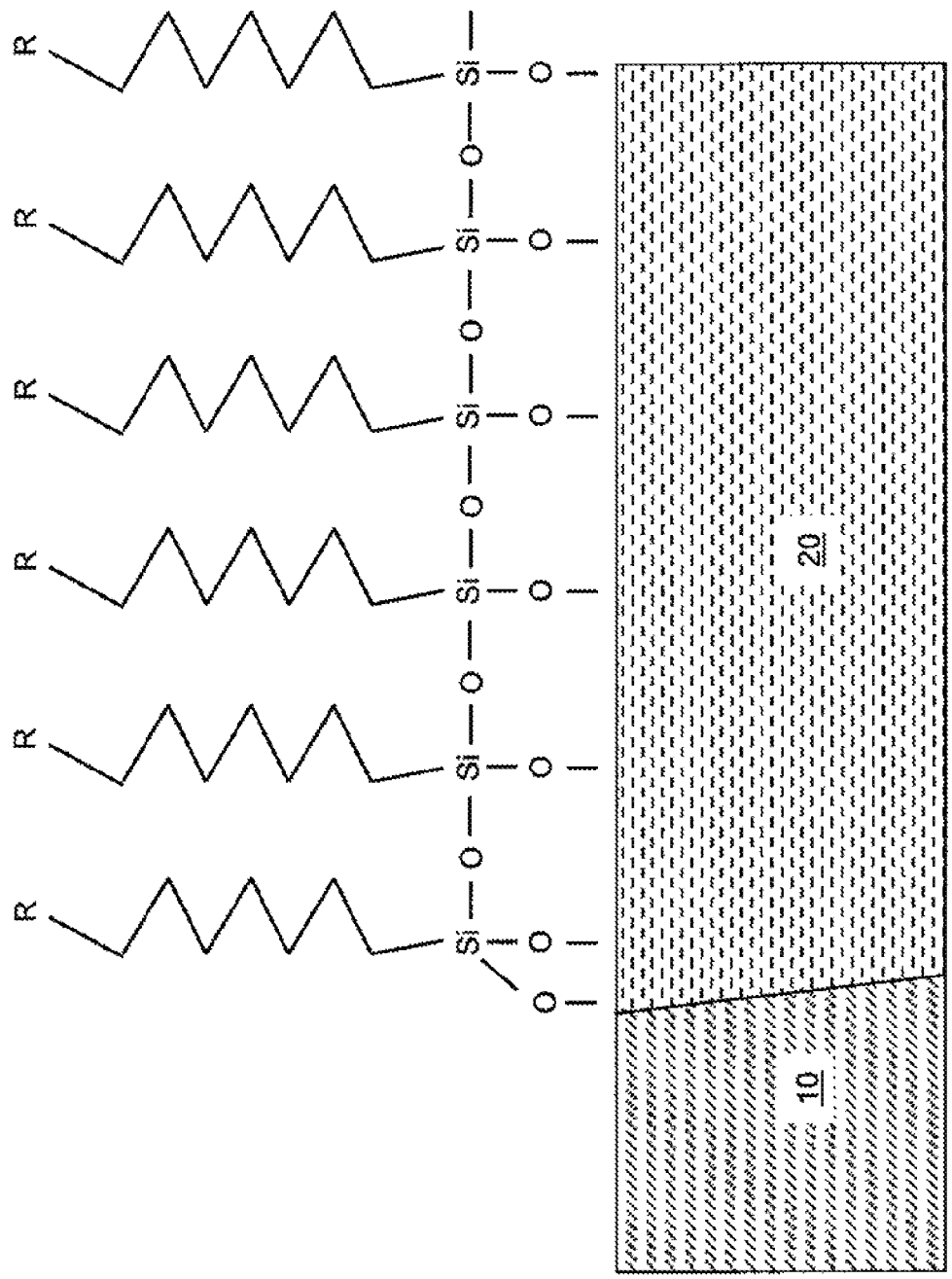
FIG. 3 is a schematic view of the atomic arrangement in the self-assembling chemical monolayer.

Referring to FIG. 3, the atomic arrangement of the derivative of the self-aligning dielectric molecule in the self-assembling chemical monolayer 30 is schematically shown. The —OH groups on the top surface of the dielectric material portion 20 lose hydrogen atoms so that the oxygen atom may bond with the silicon atom of the self-aligning dielectric molecule in the form of the derivative without the first functional group Q through dehydration reactions. Thus, the oxygen atoms on the top surface of the dielectric material portion 30 bond directly with the silicon atom in the derivative of the self-aligning dielectric molecule having the form Si—$(CH_2)_n$—R.

Since only the side with the silicon atom may be bonded to the top surface of the dielectric material portion 20, the orientation of the derivative of the self-aligning dielectric molecule is aligned in one direction with the silicon atom located on the proximal side, i.e., the side close to the surface of the dielectric material portion 20, and the second functional group R located on the distal side, i.e., the side far away from the surface of the dielectric material portion 20. Because the second functional group does not include any —OH group, additional self-aligning dielectric molecule may not be aligned on top of the first monolayer of the bonded molecules in the self-assembling chemical monolayer 30. Thus, the thickness of the self-assembling chemical monolayer 30 is automatically limited to one monolayer of the derivative of the self-aligning dielectric molecules having a chemical formula of Si—$(CH_2)_n$—R.

The thickness of the self-assembling chemical monolayer 30 depends on the number of —$CH_2$— units in the alkylene chain —$(CH_2)_n$—, and to the species of the second functional group R. Typically, the thickness of the self-assembling chemical monolayer 30 is from 1 nm to 6 nm, although lesser and greater thickness are also contemplated herein.

Figure 4:
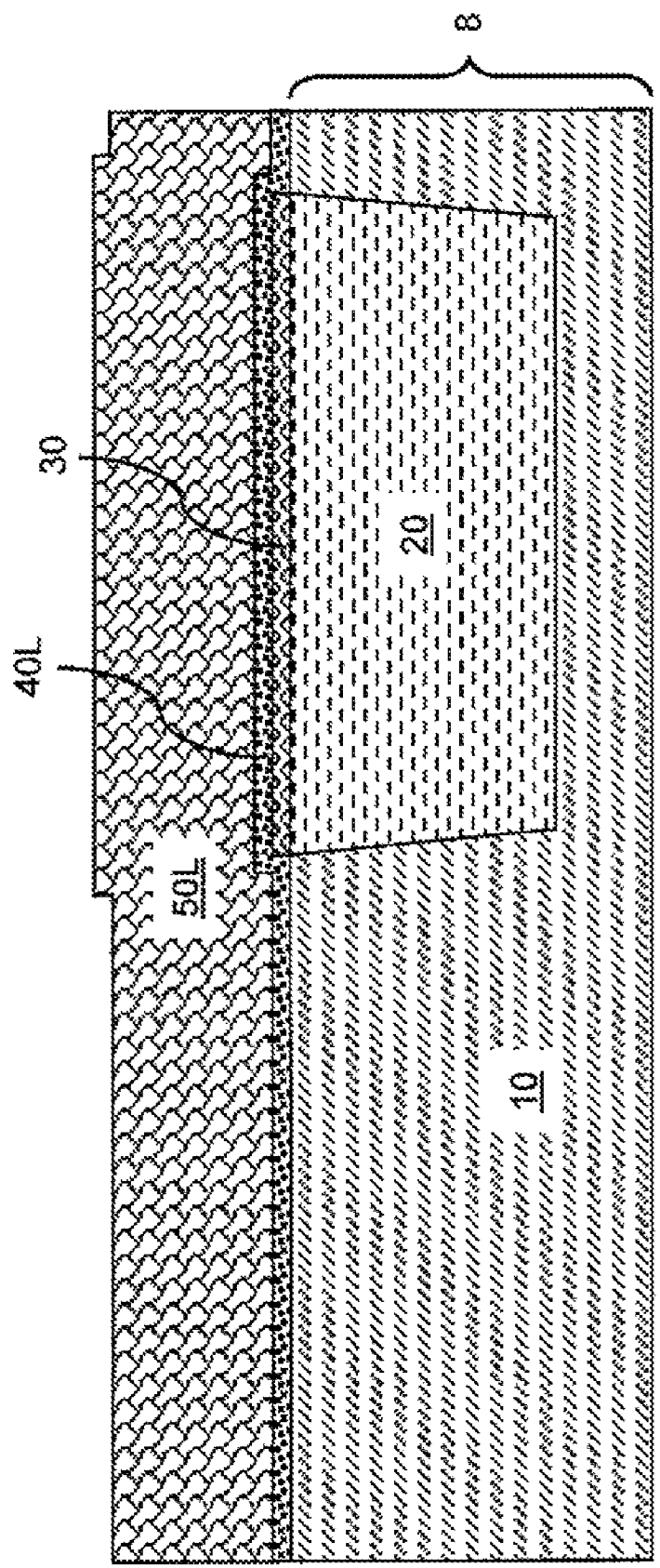
FIG. 4 is a vertical cross-sectional view of the exemplary semiconductor structure after formation of a metal-oxide-containing dielectric material layer and a conductive material layer according to the present invention.

Referring to FIG. 4, a metal-oxide-containing dielectric material layer 40L is formed on the top surface of the self-assembling chemical monolayer 30 and the exposed top surface of the semiconductor material portion 10. The metal-oxide-containing dielectric material layer 40L has a dielectric constant greater than 4.0. Preferably, the metal-oxide-containing dielectric material layer 40L comprises a dielectric metal oxide and having a dielectric constant that is greater than the dielectric constant of silicon nitride of 7.5. In this case, the metal-oxide-containing dielectric material layer 40L may comprise materials that are commonly known as high dielectric constant (high-k) material. The metal-oxide-containing dielectric material layer 40L may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc.

The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, and non-stoichiometric variants thereof. Each value of x is independently from about 0.5 to about 3 and each value of y is independently from 0 to about 2. The thickness of the metal-oxide-containing dielectric material layer 40L may be from about 1 nm to about 10 nm, and preferably from about 1.5 nm to about 3 nm. The metal-oxide-containing dielectric material layer 40L may have an effective oxide thickness (EOT) on the order of, or less than, 1 nm. The metal-oxide-containing dielectric material layer 40L may function as a gate dielectric layer in semiconductor devices.

The metal-oxide-containing dielectric material layer 40L may optionally further comprise an interfacial layer (not shown) between the portion of the high-k dielectric material and the substrate 8. The interfacial layer, which preferably comprises silicon oxide or silicon oxynitride, helps minimize mobility degradation due to high-k dielectric material.

Subsequently, a conductive material layer 50L is formed on the top surface of the metal-oxide-containing dielectric material layer 40L. See FIG. 4 as well. The conductive material layer 50L may be formed on the metal-oxide-containing dielectric material layer 40L, for example, by chemical vapor deposition (CVD), physical vapor deposition (PVD), atomic layer deposition (ALD), etc.

In one embodiment, the conductive material layer 50L comprises a metal such as Ru, Pd, Pt, Co, Ni, $Ta_xAl_yN$, $W_xC_yN$, Zr, W, Ta, Hf, Ti, Al, a metal carbide, a conductive metal oxide, a conductive metal nitride, a transition metal aluminide, a metal silicide, and a combination thereof. Each value of x is independently from 0 to about 1 and each value of y is independently from 0 to about 1. Exemplary transition metal aluminide include $Ti_3Al$ and ZrAl.

In another embodiment, the conductive material layer 50L comprises a semiconductor material such as silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor material may be amorphous or polycrystalline. The semiconductor material may be deposited as an in-situ doped material, or dopants may be introduced into a substantially intrinsic (undoped) semiconductor material.

The thickness of the conductive material layer 50L may be from 3 nm to 300 nm, and typically from 5 nm to 20 nm, although lesser and greater thicknesses are also contemplated herein.

Figure 5:
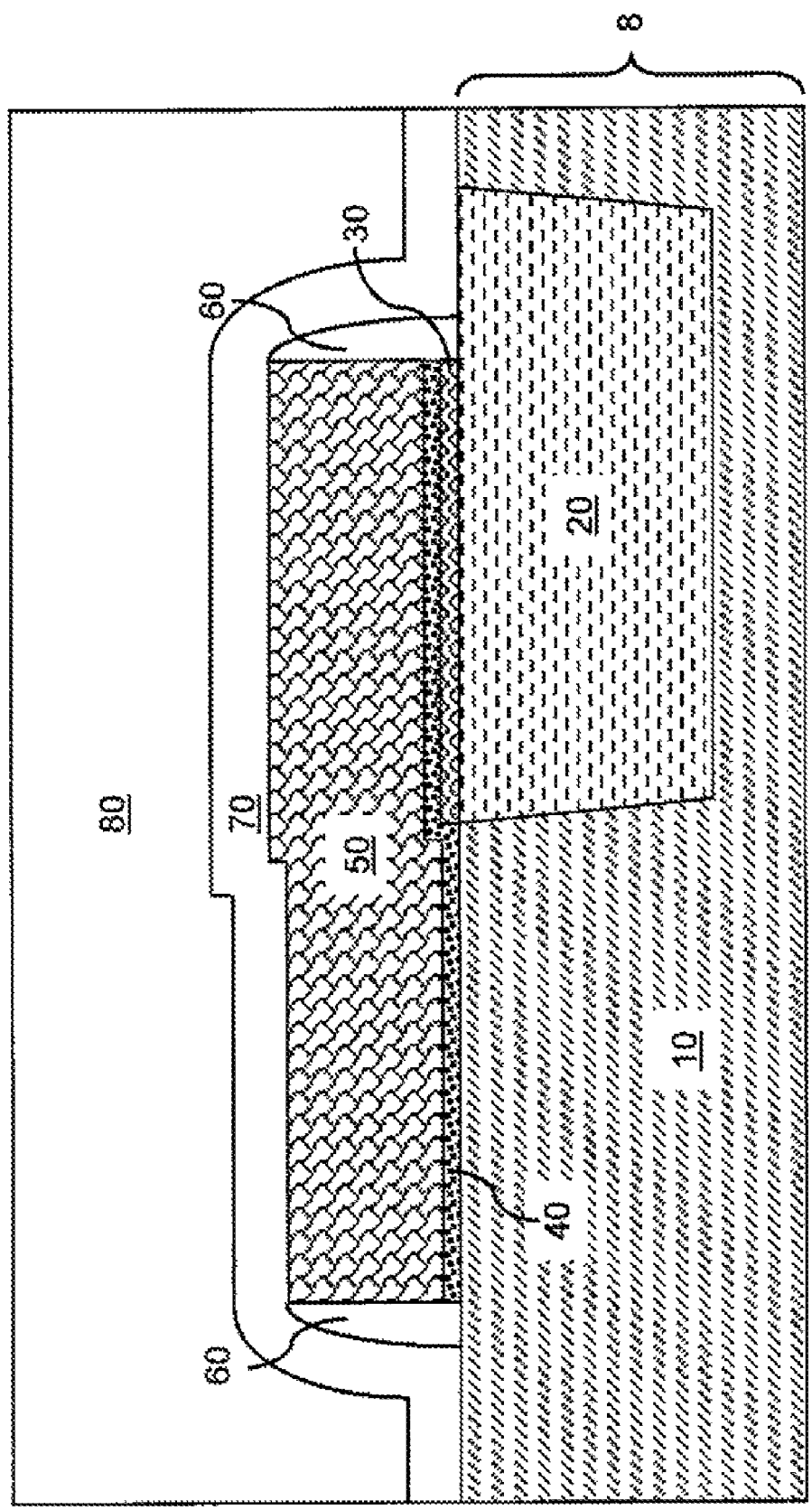
FIG. 5 is a vertical cross-sectional view of the exemplary semiconductor structure after formation of a gate structure according to the present invention.

Referring to FIG. 5, a gate structure is formed by patterning the conductive material layer 50L and the metal-oxide-containing dielectric material layer 40L. For example, a photoresist (not shown) may be applied on the top surface of the conductive material layer 50L and patterned by lithographic means through exposure and development. The pattern in the photoresist is transferred into the conductive material layer 50L and the metal-oxide-containing dielectric material layer 40L to form a stack of a metal-oxide-containing dielectric material portion 40 and a conductive material portion 50.

The self-assembling chemical monolayer 30 directly contacts the top surface of the dielectric material portion 20 and the metal-oxide-containing dielectric material portion 40. The self-assembling chemical monolayer 30 does not contact the top surface of the semiconductor material portion 10.

In one embodiment, the conductive material portion 50 may be a gate electrode of a field effect transistor and the metal-oxide-containing dielectric material portion 40 may be the gate dielectric of the field effect transistor. In this case, the semiconductor material portion 10 includes a sub-portion which is a body of the field effect transistor.

Optionally, a gate spacer 60 comprising a dielectric material may be formed on the sidewalls of the conductive material portion 50. For example, the gate spacer 60 may be formed by a conformal deposition of a dielectric material layer followed by an anisotropic etch that removes horizontal portions of the dielectric material layer. The remaining vertical portion of the dielectric material layer constitutes the gate spacer 60. Preferably, the gate spacer 60 comprises a dielectric material that blocks diffusion of oxygen. For example, the gate spacer 60 may comprise silicon nitride. In case the gate spacer 60 and the self-assembling chemical monolayer 30 block the diffusion of oxygen into the metal-oxide-containing dielectric material portion 40, the composition of the metal-oxide-containing dielectric material portion 40 does not change significantly over the lifetime of the field effect transistor.

The gate spacer 60 may abut the top surface of the dielectric material portion 20, the top surface of the semiconductor material portion 10, a sidewall of the metal-oxide-containing dielectric material portion 40, and sidewalls of the self-assembling chemical monolayer 30. Electrical dopants may be introduced into selected regions of the semiconductor material portion 10 by masked ion implantation. Metal semiconductor alloy regions may be formed on exposed portions of the semiconductor material portion as needed.

A mobile ion diffusion barrier layer 70 is deposited over the top surface of the conductive material portion, the gate spacer 60, the top surface of the semiconductor material portion 10, and the dielectric material portion 20. The mobile ion diffusion barrier layer 70 comprises a material that blocks diffusion of mobile ions such as Na+ and K+. For example, the mobile ion diffusion barrier layer 60 comprises silicon nitride. Preferably, the mobile ion diffusion barrier layer 60 also blocks diffusion of oxygen as well to prevent a change in the composition of the metal-oxide-containing dielectric material portion 40. The thickness of the mobile ion diffusion barrier layer 70 is typically from 10 nm to 80 nm.

A middle-of-line (MOL) dielectric layer 80 is deposited over the mobile ion diffusion barrier layer 70. The MOL dielectric layer 80 may comprise, for example, a CVD oxide, an organosilicate glass, spin-on glass, or a spin-on low-k dielectric material. Exemplary materials for the CVD oxide include an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer 80 is typically from 200 nm to 600 nm. The MOL dielectric layer 80 is preferably planarized, for example, by chemical mechanical polishing (CMP). Various contact via holes (not shown) are formed in the MOL dielectric layer 80 and filled with metal to from various contact vias (not shown). Back-end-of-line (BEOL) metal interconnect structures are formed on top of the MOL dielectric layer 80.

The self-assembling chemical monolayer 30 blocks diffusion of oxygen from the dielectric material portion 20 into the metal-oxide-containing dielectric material portion 40. Further, the gate spacer 60 and the mobile ion diffusion barrier layer 70 block diffusion of oxygen from the MOL dielectric layer 80. Thus, the metal-oxide-containing dielectric material portion 40 is isolated from sources of oxygen by a combination of the self-assembling chemical monolayer 30, the gate spacer 60, and the mobile ion diffusion barrier layer 70. Because the oxygen content of the metal-oxide-containing dielectric material portion 40, the threshold voltage shift due to changes in the oxygen content in the field effect transistor is eliminated or minimized.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a dielectric material portion embedded in a semiconductor material portion of a substrate;
   a chemical monolayer bonded to a top surface of said dielectric material portion through Si—O—Si bonds and comprising a dielectric molecule including a silicon atom and at least one alkylene moiety; and
   a metal-oxide-containing dielectric material layer located on a top surface of said semiconductor material portion and said chemical monolayer.

2. The semiconductor structure of claim 1, wherein said top surface of said dielectric material portion and said top surface of said semiconductor material potion are substantially coplanar.

3. The semiconductor structure of claim 1, wherein said dielectric material portion comprises a dielectric material that forms a hydroxylated surface having —OH groups in water.

4. The semiconductor structure of claim 3, wherein said dielectric material comprises at least one of amorphous silicon oxide, crystalline silicon oxide, borosilicate glass, phosphosilicate glass, fluorosilicate glass, arsenosilicate glass, borophosphosilicate glass, mica, aluminum oxide, and oxidized gold.

5. The semiconductor structure of claim 1, wherein said semiconductor material portion comprises at least one of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

6. The semiconductor structure of claim 5, wherein said semiconductor material portion is single crystalline.

7. The semiconductor structure of claim 1, wherein said chemical monolayer abuts said top surface of said dielectric material portion and said metal-oxide-containing dielectric material layer but does not abut said top surface of said semiconductor material portion.

8. The semiconductor structure of claim 7, further comprising a conductive material portion located on a top surface of said metal-oxide-containing dielectric material layer.

9. The semiconductor structure of claim 8, wherein said conductive material portion is a gate electrode of a field effect transistor, wherein said metal-oxide-containing dielectric material layer is a gate dielectric of said field effect transistor, and wherein said semiconductor material portion includes a body of said field effect transistor.

10. The semiconductor structure of claim 9, further comprising a gate spacer comprising a dielectric material and overlying said dielectric material portion.

11. The semiconductor structure of claim 10, wherein said gate spacer abuts said top surface of said dielectric material portion, said top surface of said semiconductor material portion, a sidewall of said metal-oxide-containing dielectric material layer, and said chemical monolayer.

12. The semiconductor structure of claim 7, wherein said metal-oxide-containing dielectric material layer comprises a metal oxide having a dielectric constant greater than 4.0.

13. The semiconductor structure of claim 12, wherein said metal-oxide-containing dielectric material layer comprises at least one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, and non-stoichiometric variants thereof, wherein each value of x is independently from about 0.5 to about 3 and each value of y is independently from 0 to about 2.

14. The semiconductor structure of claim 1, wherein said dielectric molecule has a chemical formula of $SiQ\text{-}(CH_2)_n\text{—}R$, wherein Q is a first functional group that dissociates in water from a silicon atom, and wherein R is a second functional group including carbon or nitrogen, and wherein n is a positive integer.

15. The semiconductor structure of claim 14, wherein said first functional group is $Cl_3$, $Cl_2OX$, $ClOXOY$, or $OXOYOZ$, and wherein each of X, Y, and Z is independently a hydrogen atom or an alkyl moiety.

16. The semiconductor structure of claim 14, wherein said second functional group is $CH_3$ or $NH_2$.

17. A method of forming a semiconductor structure comprising:
   forming a dielectric material portion in a semiconductor material portion of a substrate;
   forming a dielectric material layer comprising a dielectric material on a top surface of said dielectric material portion while not depositing said dielectric material on any exposed surface of said semiconductor material portion; and
   forming a metal-oxide-containing dielectric material layer on said exposed surface of said semiconductor material portion and on said dielectric material layer that is formed on said top surface of said dielectric material portion.

18. The method of claim 17, wherein said dielectric material comprises a material that forms a hydroxylated surface having —OH groups in water.

19. The method of claim 18, wherein said dielectric material comprises at least one of amorphous silicon oxide, crystalline silicon oxide, borosilicate glass, phosphosilicate glass, fluorosilicate glass, arsenosilicate glass, borophosphosilicate glass, mica, aluminum oxide, and oxidized gold.

20. The method of claim 17, wherein said dielectric material layer is a chemical monolayer.

21. The method of claim 20, wherein said chemical monolayer directly contacts said top surface of said dielectric material portion but does directly contact said exposed surface of said semiconductor material portion, and wherein said metal-oxide-containing dielectric material layer is formed directly on said chemical monolayer and said exposed surface of said semiconductor material portion.

22. The method of claim 20, wherein said chemical monolayer is bonded to said top surface of said dielectric material portion through Si—O—Si bonds, and wherein said chemical monolayer comprises a dielectric molecule including a silicon atom and at least one alkylene moiety.

23. The method of claim 20, wherein said chemical monolayer comprises a dielectric molecule having a chemical formula of SiQ-$(CH_2)_n$—R, wherein Q is a first functional group that dissociates in water from a silicon atom, wherein R is a second functional group including carbon or nitrogen, and wherein n is a positive integer.

24. The method of claim 23, wherein said first functional group is $Cl_3$, $Cl_2OX$, ClOXOY, or OXOYOZ, and wherein each of X, Y, and Z is independently a hydrogen atom or an alkyl moiety.

25. The method of claim 23, wherein said second functional group is $CH_3$ or $NH_2$.

* * * * *